(12) United States Patent
Zimlich

(10) Patent No.: US 7,936,203 B2
(45) Date of Patent: May 3, 2011

(54) TEMPERATURE COMPENSATION VIA POWER SUPPLY MODIFICATION TO PRODUCE A TEMPERATURE-INDEPENDENT DELAY IN AN INTEGRATED CIRCUIT

(75) Inventor: David Zimlich, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 203 days.

(21) Appl. No.: 11/351,037

(22) Filed: Feb. 8, 2006

(65) Prior Publication Data
US 2007/0182469 A1 Aug. 9, 2007

(51) Int. Cl.
*H01L 35/00* (2006.01)
*H01L 37/00* (2006.01)
*H03K 3/42* (2006.01)
*H03K 17/78* (2006.01)

(52) U.S. Cl. ........................................ 327/512
(58) Field of Classification Search .................. 327/512
See application file for complete search history.

(56) References Cited

U.S. PATENT DOCUMENTS

| | | | | | |
|---|---|---|---|---|---|
| 4,677,369 | A | * | 6/1987 | Bowers et al. | 323/314 |
| 4,887,181 | A | * | 12/1989 | Lenz | 361/103 |
| 5,085,526 | A | * | 2/1992 | Sawtell et al. | 374/101 |
| 5,109,165 | A | * | 4/1992 | Gusakov | 327/512 |
| 5,691,661 | A | * | 11/1997 | Fukuda et al. | 327/172 |
| 5,912,595 | A | * | 6/1999 | Ma et al. | 331/117 D |
| 7,012,459 | B2 | * | 3/2006 | Sutherland | 327/513 |
| 7,106,127 | B2 | * | 9/2006 | Sim et al. | 327/512 |
| 7,127,368 | B2 | * | 10/2006 | Choi | 702/130 |
| 7,256,643 | B2 | * | 8/2007 | Pan et al. | 327/539 |
| 7,345,460 | B2 | * | 3/2008 | Ma et al. | 323/283 |
| 7,489,184 | B2 | * | 2/2009 | Pan et al. | 327/539 |
| 2006/0111865 | A1 | * | 5/2006 | Choi | 702/130 |
| 2008/0036447 | A1 | * | 2/2008 | Slater et al. | 324/105 |
| 2008/0150642 | A1 | * | 6/2008 | Partridge et al. | 331/66 |
| 2008/0164953 | A1 | * | 7/2008 | Partridge et al. | 331/66 |
| 2010/0117715 | A1 | * | 5/2010 | Ariyama | 327/512 |
| 2010/0315138 | A1 | * | 12/2010 | Namba et al. | 327/157 |

OTHER PUBLICATIONS

U.S. Appl. No. 11/328,694, filed Jan. 4, 2006, Bo Liu.

(Continued)

*Primary Examiner* — Lincoln Donovan
*Assistant Examiner* — Adam D Houston
(74) *Attorney, Agent, or Firm* — Wong, Cabello, Lutsch, Rutherford & Brucculeri, LLP

(57) ABSTRACT

A method and circuitry for adjusting the delay of a variable delay line (VDL) in a delay locked loop (DLL) or other delay element or subcircuit on an integrated circuit is disclosed. Such delay circuitry will inherently have a delay which is a function of temperature. In accordance with embodiments of the invention, such temperature-dependent delays are compensated for by adjusting the power supply voltage of the VDL, delay element, or subcircuit. Specifically, a temperature sensing stage is used to sense the temperature of the integrated circuit, and hence the VDL, delay element, or subcircuit. Information concerning the sensed temperature is sent to a regulator which derives the local power supply voltage from the master power supply voltage, Vcc, of the integrated circuit. If the temperature sensed is relatively high, which otherwise would increase the delay though the VDL, delay element, or subcircuit, the regulator increases the local power supply voltage, thus decreasing the delay and offsetting the increase in delay due to temperature. Through this scheme, and assuming the temperature sensing stage is properly tuned, temperature-dependent delays can be reduced to approximately zero.

38 Claims, 9 Drawing Sheets

OTHER PUBLICATIONS

U.S. Appl. No. 11/330,987, Jan. 12, 2006, David Zimlich.

S. Kuge et al., "A 0.18-µm 256-Mb DDR-SDRAM with Low-Cost Post-Mold Tuning Method for DLL Replica," IEEE J. of Solid-State Circuits, vol. 35, No. 11, pp. 1680-1687 (Nov. 2000).

Shigehiro Kuge et al. "A 0.18-um 256-Mb DDR-SDRAM with Low-Cost Post-Mold Tuning Method for DLL Replica." IEEE Journal of Solid-State Circuits, vol. 35, No. 11, Nov. 2000. pp. 1680-1689.

Ma, Dongsheng, et al., "Thermal Compensation Method for CMOS Digital Integrated Circuits Using Temperature-Adaptive DC-DC Converter", IEEE Transactions on Circuits and Systems-II: Express Briefs, vol. 53, No. 11, pp. 1284-1288, Nov. 2006.

Kanda, Kouichi, et al., "Design Impact of Positive Temperature Dependence on Drain Current in Sub-1-V CMOS VLSIs", IEEE Journal of Solid-State Circuits, vol. 36, No. 10, pp. 1559-1564, Oct. 2001.

Achenbach, Ralf, et. al., "A Digitally Temperature-Compensated Crystal Oscillator", IEEE Journal of Solid-State Circuits, vol. 35, No. 10, pp. 1502-1506, Oct. 2000.

\* cited by examiner

TEMPERATURE COMPENSATION VIA POWER SUPPLY MODIFICATION TO PRODUCE A TEMPERATURE-INDEPENDENT DELAY IN AN INTEGRATED CIRCUIT

FIELD OF THE INVENTION

Embodiments of this invention relate to the use of a temperature sensor to produce a temperature-independent delay in a delay element in an integrated circuit.

BACKGROUND

It is often desired in an integrated circuit to delay a signal. In the context of a periodic signal like a clock signal, adjustment of delay can be understood as an adjustment of the phase of the signal. Such phase shifting of a clock signal can be achieved by use of a delay locked loop (DLL), which is commonly used to generate internal clock signals for an integrated circuit from a master external clock signal. Because of the complexity of modern-day integrated circuits, the ability to finely shift the phase of clock signal is particularly important to ensure proper timing and synchronization within the circuit.

A typical DLL is shown in FIG. 1. As shown, the DLL derives an (internal) output clock signal (ClkOut) (or more than one output clock signal; only one is shown for simplicity) from an (external) input clock signal (ClkIn), in which the phase or delay between the two clocks can be tightly controlled. The DLL comprises a variable delay line (VDL) 12 for providing a variable amount of delay to the input clock signal, and a delay module (DM) 14 for providing a fixed delay to the input clock signal. The output of the (DM) 14 (essentially, a representation of the output clock) and the input clock signal, ClkIn, are compared at a phase detector (PD) 16, which essentially determines whether one of these signals is lagging or leading the other, and seeks to bring these two phases into alignment. For example, if the output of the (DM) 14 leads ClkIn, then the phase detector outputs an "Up" signal, which increases the delay through the VDL 12. By contrast, if the output of the (DM) 14 lags ClkIn, then the phase detectors outputs a "Down" signal to decrease the delay through the VDL 12. Through this scheme, the output clock signal, ClkOut, is locked into a phase relationship with the input clock signal, ClkIn.

One example of a variable delay line (VDL 12) is shown in FIG. 2. As mentioned above, the VDL 12 receives control signals "Up" or "Down" from the phase detector 16 to control the amount of delay that VDL 12 imparts to the input clock signal, ClkIn. In this regard, the exemplary VDL 12 is comprised of a plurality of stages 20a-d. Four such stages 20 are shown in FIG. 2 for simplicity, but a realistic VDL 12 would normally have tens of stages. Each stage 20 in this example comprises a D flip flop 22 and a few NAND gates. The control signals "Up" and "Down" from the phase detector 16 adjust at which stage 20 the ClkIn signal will enter the VDL 12, which in turn defines the delay the VDL imparts. For example, as shown, the "Up"/"Down" control signals have been used to set stage 20c as the entry point for ClkIn. Accordingly, the outputs Q/Q* of flip flop 22c have been set to 1/0, while all other flip flops 22a, 22b, and 22d have their outputs set to 0/1. As these logic signals percolate through the NAND gates as shown, it can be seen that ClkIn will pass through the NAND gates only in entry stage 20c and all subsequent stages (i.e., 20d), and the inherent delays in those NAND gates will function to delay the signal.

Should the phase detector 16 determine that the delay needs adjustment, one of control signals "Up" or "Down" would be asserted. For example, assume from the initial condition in FIG. 2 that an "Up" signal is subsequently asserted, because the phase detector has decided that further delay is warranted in the VDL 12. This would shift the asserted flip flop 22 output Q/Q* of 1/0 to the next stage to the left, i.e., to flip flop 22b, with all other flip flop outputs set to 0/1. As a result, the ClkIn signal would now enter the VDL at stage 20b, and hence would pass through the NAND gates in stages 20b, 20c, and 20d, thus increasing the delay through the VDL 12. By contrast, a "Down" signal would shift the entry point one stage 20 to the right, decreasing the delay through the VDL 12. In other embodiments, the control signals "Up" and "Down" could be combined for example, and thus only one control signal is necessary to control the VDL 12 in many useful embodiments, although two digital control signals are shown in FIG. 1.

It is typical to provide the circuit elements in the VDL 12 (the flip flops 22, the NAND gates, etc.) with a dedicated power supply voltage node (VccVDL) which is isolated from the master power supply voltage (Vcc) of the integrated circuit, as is shown in block diagram form in FIG. 1. Providing an isolated power supply to the VDL 12 is beneficial to prevent perturbations in the master power supply Vcc from being seen by the VDL 12 and adversely affecting its delay. Such isolation is important: without isolation, if the VccVDL node becomes higher than normal because of perturbations present on Vcc, delay through the VDL 12 will be quicker than expected, because a higher power supply voltage will cause the circuit elements in the VDL 12 to act more quickly. Conversely, if VccVDL node becomes lower than normal, the opposite occurs, and delay through the VDL 12 will be slower than expected.

To isolate these two power supplies, and as shown in FIG. 1, VccVDL is generated from the master power supply Vcc using a voltage regulator circuit 15. The details of such a regulator circuit 15 are variant and well known, and hence are not shown for simplicity. While VccVDL is shown as comprising an isolated power supply dedicated only to the VDL circuitry, one skilled in the art will realize that this isolated power supply may be used to power other subcircuits in the integrated circuit as well, depending on the designer's preferences and subject to the noise tolerance of the VDL 12.

While the regulator 15 may protect the VDL 12 from power supply voltage variations which could effect its delay, the VDL 12 still remains subject to variations in delay due to temperature. Such variation is illustrated in FIG. 6A. Shown are the results of a computer simulation that models the output of the VDL 12 (ClkOut) versus its input (ClkIn, set to MHz in the simulation). As can be seen, the delay imparted by the VDL 12 varies significantly with temperature. When the delays at 0 degrees Celsius (0 C) and 100 degrees Celsius (100 C) are simulated through some set number of stages 20 (FIG. 2), it is seen that a difference of approximately 220 picoseconds exists in the delays at these two temperature extremes. Obviously, this is not ideal: the delay through the VDL 12 is preferably not dependent on the vagaries of temperature, but instead is preferably only affected by the phase detector 16 control signals, "Up" and "Down."

In the context of a DLL circuit 10, such temperature variations, and resulting delay variations in delay through the VDL, are in theory addressed and remedied via the feedback loop that the DLL provides. However, because of the feedback nature of the DLL 10, the DLL cannot remediate itself immediately: it can take some time for the output (ClkOut) to reflect modification in the VDL 12 as necessitated by temperature changes. Moreover, depending on the loop filter characteristics of the DLL's feedback path, changes in the output (ClkOut) warranted by temperature changes could become unstable and resonate. Such effects can become more pronounced when the integrated circuit switches between modes which vary in their power consumption, and thus cause sharp variations in temperature. In a Synchronous Dynamic Random Access Memory (SDRAM) for example, switching between normal and self-refresh modes of operation provides a good example of a mode switch which can affect integrated circuit temperatures and therefore DLL performance.

In short, when the feedback nature of the DLL is used to compensate for the effects of temperature on the VDL 12, jitter can result in the output of the DLL, meaning that the phase of the output can vary significantly from the locked phase condition the DLL seeks to establish. Such jitter is obviously undesirable, especially when it is considered that temperature-related jitter at its worst case can take on the order of at least a period of a clock cycle before being compensated for.

Moreover, even outside the context of DLLs, FIG. 6A should be understood as illustrative concerning the effects of temperature on delay elements generally. Although FIG. 6A illustrates the effects of temperature on the delay of a VDL 12, the fact remains that other types of delay elements would also behave similarly: at higher temperatures, the delays would be inherently longer than at lower temperatures. Delay elements are used in all sorts of circuitry in an integrated circuit, and in many applications it would be highly desirable that the delays they produce not be dependent on temperature.

The solutions described in this disclosure address the above-mentioned problems.

SUMMARY

A method and circuitry for adjusting the delay of a variable delay line (VDL) in a delay locked loop (DLL) or other delay element or subcircuit on an integrated circuit is disclosed. Such delay circuitry will inherently have a delay which is a function of temperature. In accordance with embodiments of the invention, such temperature-dependent delays are compensated for by adjusting the power supply voltage of the VDL, delay element, or subcircuit. Specifically, a temperature sensing stage is used to sense the temperature of the integrated circuit, and hence the VDL, delay element, or subcircuit. Information concerning the sensed temperature is sent to a regulator which derives the local power supply voltage from the master power supply voltage, Vcc, of the integrated circuit. If the temperature sensed is relatively high, which otherwise would increase the delay though the VDL, delay element, or subcircuit, the regulator increases the local power supply voltage, thus decreasing the delay and offsetting the increase in delay due to temperature. Through this scheme, and assuming the temperature sensing stage is properly tuned, temperature-dependent delays can be reduced to approximately zero.

BRIEF DESCRIPTION OF THE DRAWINGS

Embodiments of the inventive aspects of this disclosure will be best understood with reference to the following detailed description, when read in conjunction with the accompanying drawings, in which.

DETAILED DESCRIPTION

As noted in the above Summary, the disclosed technique for compensating for the temperature dependency of delays in the VDL is addressed by sensing the temperature, and modifying the VDL's power supply voltage, VccVDL, to cancel out such temperature dependency.

Figure 3:
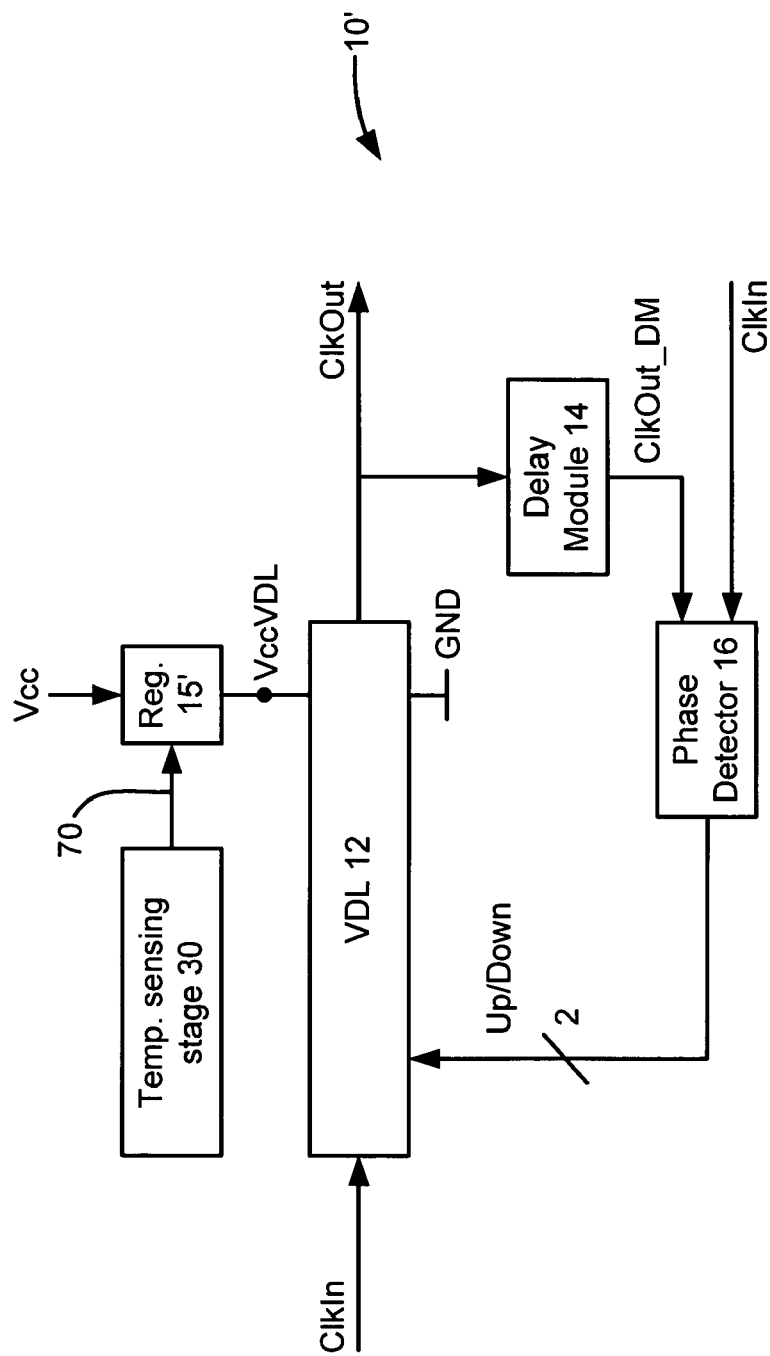
FIG. 3 illustrates an embodiment of a DLL in accordance with an embodiment of the invention, in which a temperature sensing stage is used to provide temperature information to a voltage regulator to adjust the power supply voltage of the VDL to render a delay that is temperature independent.

Accordingly, and referring to FIG. 3, a temperature sensing stage 30 has been added to the improved DLL circuit 10'. As shown, the temperature sensing stage 30 provides information 70 concerning sensed temperature to an improved voltage regulator circuit 15', which is used to generate the VDL's power supply voltage (VccVDL) from the integrated circuit's master power supply voltage (Vcc). The improved voltage regulator circuit 15', knowing information 70 about the temperature from the temperature sensing stage 30, adjusts VccVDL to an appropriate value to compensate the effect that changes in temperature will have on the delay through the VDL 12. Specifically, if the temperature is relatively high, or is increasing, so as to inherently increase the delay through the VDL 12, the improved regulator 15' will cause VccVDL to likewise increase to speed up transmission through the VDL 12 and offset the temperature-dependent increase in delay. Conversely, if the temperature is relatively low, or is decreasing, so as to inherently decrease the delay through the VDL 12, the improved regulator 15' will cause VccVDL to likewise decrease to slow down transmission through the VDL 12 and offset the temperature-dependent decrease in delay.

Figure 4:
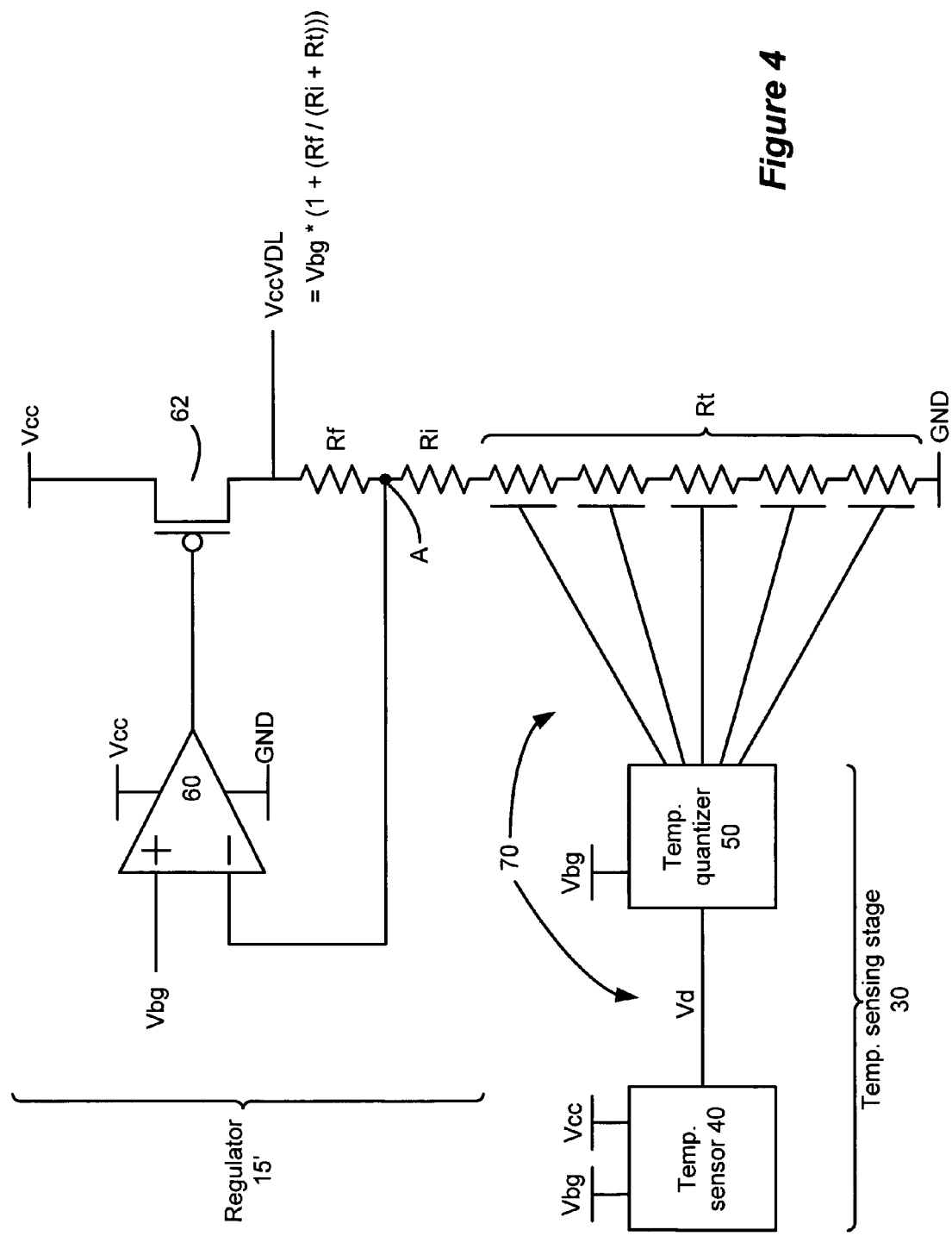
FIG. 4 illustrates an embodiment of the temperature sensing stage and the voltage regulator of FIG. 3 in further detail.

Further details of the temperature sensing stage 30 and the improved regulator circuit 15' are shown in FIG. 4. As shown, inputs to both the temperature sensing stage 30 and the improved regulator 15' include both the master power supply, Vcc, and a bandgap reference voltage, Vbg. As one skilled in the art understands, a bandgap reference voltage is a temperature-independent reference voltage (typically approximately 1.2 V) which is generated from the master power supply voltage, Vcc. For more information concerning bandgap reference voltages and circuits useable to generate them, the reader is referred to U.S. patent application Ser. No. 11/330,987, filed Jan. 12, 2006, which is incorporated herein by reference in its entirety.

In the disclosed embodiment, the improved regulator 15' comprises a low drop-out (LDO) regulator which includes an operation amplifier ("op amp") 60 driving a P-channel transistor 62 as the regulator's pass element. Because the op amp 60 receives the bandgap reference potential Vbg at an input, and because the feedback loop will force the equivalent voltage at node A, the output voltage VccVDL, i.e., the power supply voltage for the VDL 12, is set equal to:

$$VccVDL = Vbg^{*}(1+(Rf/(Ri+Rt))) \quad (1)$$

In accordance with embodiments of the invention, the magnitude of the output voltage VccVDL produced by the regulator 15' is set based on temperature information 70 sent by the temperature sensing stage 30. As will be seen, such temperature information 70 tailors VccVDL by adjusting the magnitude of the gain resistor Rt in the improved regulator 15'. In so doing, the temperature information 70 produces the desired compensation: as the temperature increases, Rt will decrease and VccVDL will increase per Equation 1, which in turn will reduce the delay through the VDL 12 and offset the increase in delay resulting from the higher temperature. Conversely, as the temperature decreases, Rt will increase and VccVDL will decrease, which will increase the delay through the VDL 12 and offset the reduction in delay resulting from the lower temperature.

Figure 5:
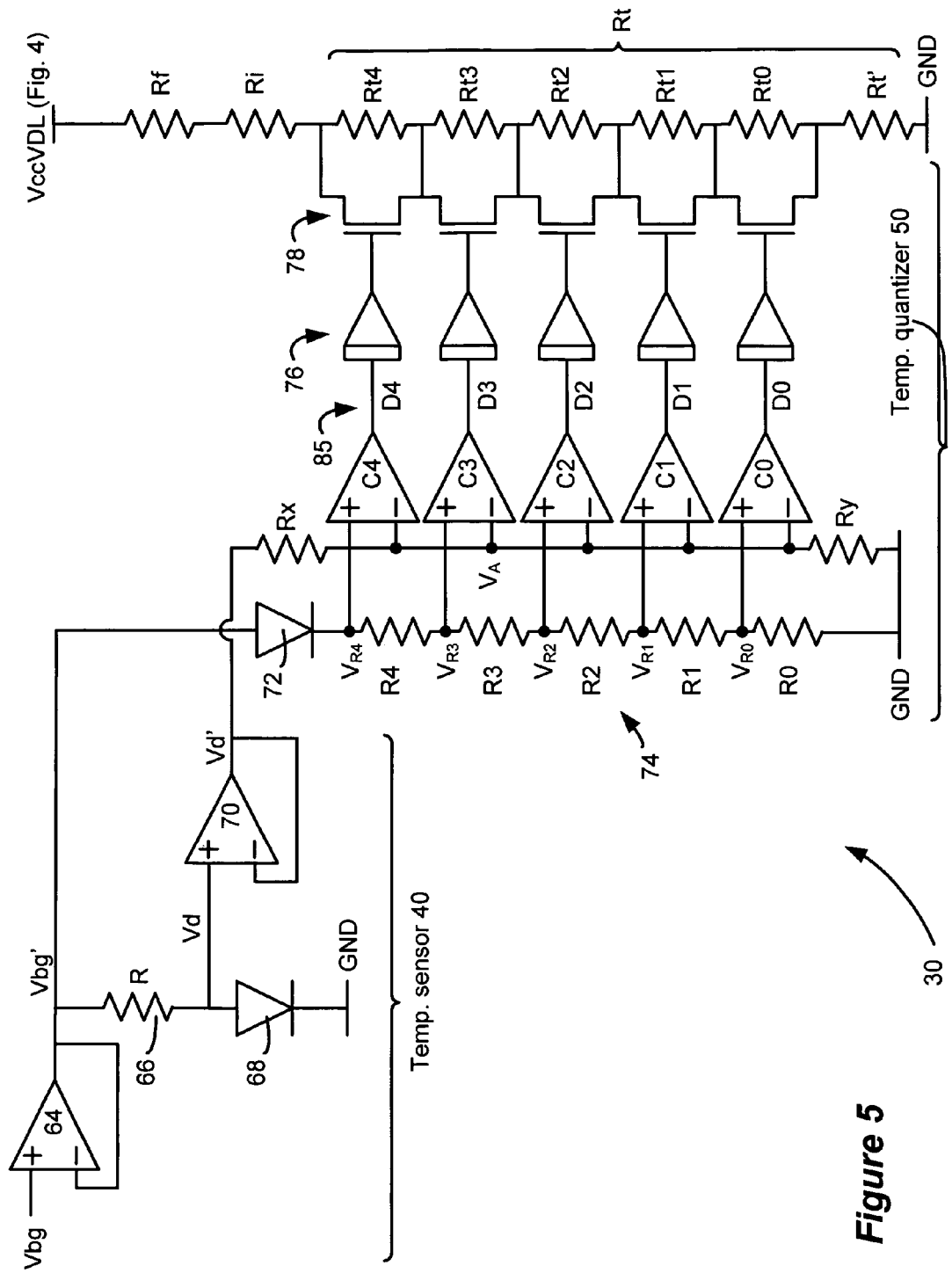
FIG. 5 illustrates even further details of an embodiment of circuitry useable for the temperature sensing stage, and includes a temperature sensor and a temperature quantizer for adjusting the regulator in accordance with detected sub-ranges of temperature.
Figure 9:
FIG. 9 illustrates in accordance with the prior art how the voltage across a diode (P-N junction) varies with temperature.

Further details of the temperature sensing stage 30 are illustrated in FIG. 5. As shown, in one embodiment, the temperature sensing stage 30 includes a temperature sensor 40 and a temperature quantizer 50. The temperature sensor 40, as its name suggests, senses the temperature, and in this embodiment does so by assessing the voltage (Vd) across a diode (P-N junction) 68. As one skilled in the art will appreciate, the voltage across a diode is temperature sensitive. More specifically, and as shown in FIG. 9, the voltage across a diode, Vd, is essentially about 0.6 V at a nominal temperature (e.g., 50 C), and varies by about −2 mV/C (i.e., dV/dT=−0.002), such that Vd is approximately 0.5 V at 100 C is approximately 0.7 V at 0 C. More details concerning the use of diodes within temperature sensors are disclosed in the above-incorporated Ser. No. 11/330,987 application. Of course, as one skilled in the art will recognize, the temperature sensitive element in the temperature sensing stage 30 can comprise more than just the singular diode 68, but could include combinations of elements (not shown for simplicity).

In any event, the voltage across the diode 68, Vd, is indicative of temperature. Moreover, because the diode voltage is derived from the temperature-insensitive bandgap reference voltage Vbg, it can be assured that any variance in Vd is a function of temperature sensitivity of the diode, as opposed to temperature sensitivity of the reference voltage, Vbg. Notice that both the bandgap reference voltage Vbg and the diode voltage Vd are preferably buffered via op amps 64 and 70 to produce equivalent-magnitude buffered signals Vbg' and Vd'. This allows these signals to be used to useful ends without worry that the circuits that generate them will become loaded.

As noted earlier, one aspect of the disclosed invention is to inform the improved regulator 15' of information 70 pertaining to the temperature so that the regulator may produce a more appropriate VDL power supply voltage (VccVDL) to compensate for the sensed temperature. In this regard, the raw diode voltage Vd (or Vd' as buffered) may comprise such temperature information 70, and when supplied to the regulator 15' may allow the regulator to adjust VccVDL appropriately.

However, in a preferred embodiment, the diode voltage Vd' is instead first provided to a temperature quantizer 50. The temperature quantizer 50 assesses the temperature information from the diode voltage Vd' and breaks (i.e., quantizes) the sensed temperature into discrete temperature ranges. Information concerning the quantized temperature is in turn used by the improved regulator 15' to control the gain resistor Rt, and to set the output voltage VccVDL to an optimal value. In other words, the quantized temperature is used to adjust the load of the improved regulator 15'.

This occurs as follows. In one embodiment, a plurality of comparators C0-C4 (e.g., op amps) are used to generate a digital bus 85 of signals (D4-D0) which represent quantization of the sensed temperature. Before explaining the effect of this digital bus 85 on the load of the improved regulator 15', generation of the digital bus 85 signals D4-D0 are discussed.

As seen in FIG. 5, each comparator C0-C4 contains a non-inverting input derived from a voltage divider 74 comprising resistors R0 through R4. A temperature-sensitive diode 72 is also used in the voltage divider 74, and the voltage divider 74 is biased at its top by the temperature-insensitive bandgap reference voltage Vbg'. Thus, as the voltage across diode 72 decreases (i.e., as the temperature increases), the voltages across the resistors R0-R4 in the voltage divider 74 will increase. By contrast, the inverting (reference) input of all of the comparators C0-C4 receives a voltage-divided version (via similar resistor types Rx and Ry) of the sensed temperature, Vd'(i.e., a temperature insensitive voltage indicative of Vd'). This causes the inverting inputs to decrease as the temperature increases. Thus, as the temperature increases, the non-inverting inputs to the comparators Cx will increase while the inverting inputs will decrease. Eventually, these inputs at the comparators Cx will cross and the comparator outputs, i.e., signals on the digital bus 85, will be triggered. Specifically, by tuning the values of the resistors R0-R4 in the voltage divider 74 and the values of the resistors Rx and Ry in the inverting-input voltage divider, the comparators can be properly tuned to provide digital signals D0-D4 that represent a quantized indication of the sensed temperature. Further, resistor Ry could be combined with trim circuitry to adjust the desired voltage/temperature trip points.

For example, assume that R0=300KΩ, R1=R4=20KΩ, Rx/Ry=⅓, Rf=22KΩ, Ri=111KΩ, and Rtx=22KΩ, and Rt'=2KΩ. Simulation shows that under such conditions, the digital bus 85 signals Dx produced in the temperature quantizer 50 will be as follows:

TABLE 1

| Vd (V) | Temperature (Celsius) | D4-D0 | VccVDL |
|---|---|---|---|
| ≧0.686 | ≦7 | 00000 | 1.319 |
| 0.670 to 0.684 | 8 to 15 | 10000 | 1.332 |
| 0.638 to 0.668 | 16 to 31 | 11000 | 1.348 |
| 0.586 to 0.636 | 32 to 57 | 11100 | 1.368 |
| 0.516 to 0.584 | 58 to 92 | 11110 | 1.396 |
| <0.514 | ≧93 | 11111 | 1.435 |

In short, the digital bus 85 signals Dx comprise a form of temperature information 70, and inform the regulator of the sensed temperature as quantized. These signals Dx may be buffered by buffers 76 (e.g., two serially-connected inverters) before being sent to the regulator 15'.

As more of the digital signals 85 are asserted with increasing temperature, more of the smaller resistors Rtx in the gain resistor Rt will be shorted out of the circuit. This occurs because assertion of a data signal Dx will create a short circuit in the channel of the N-channel transistor 78 that spans each of the smaller resistors Rtx. (If bulk effects cause the channel resistance to become relatively large, then P-channel transistors can be wired in parallel and driven complementarily). Thus, as the temperature increases, Rt (the sum of the smaller transistors Rtx) will drop, and as a result, VccVDL will increase in accordance with Equation (1), and as reflected in Table 1 above. This is exactly what the disclosed technique contemplates: as the temperature increases so as to naturally cause VDL 12 to increase in its delay, VccVDL should likewise increase to promote a shorter delay, and vice versa.

Thus, the circuitry of FIG. 5, produces a particular quantized (second) voltage (VccVdl) from a first analog voltage (Vd'), and as an intermediary to this outcome, produces a plurality of digital signals indicative of one of a plurality of temperature ranges corresponding to the sensed temperature. Thus, the output voltage VccVDL, and the regulator 15' which produces it, should be understood as comprising a subsequent portion of a temperature sensor, along with the original temperature sensor 40 and the temperature quantizer 50. In short, the disclosed technique allows for the conversion of a first analog indicator of the sensed temperature (Vd') to a second quantized analog signal indicative of a particular quantized temperature range (VccVDL). While disclosed as particularly useful to the operation of a VDL 12 in a DLL 10, it should be recognized that the generation of VccVDL should be more generally understood as the generation of a quantized output indicative of the sensed temperature. Hence, this output, in and of itself, functions as a temperature sensor, and specifically outputs a voltage (see Table 1) which is quantized so as to indicate a particular sensed temperature range (see Table 1). Such temperature sensor circuits have applicability beyond remedying problems associated with the VDLs in DLLs.

Of course, in a commercial embodiment, it will be necessary to understand how the delay through the VDL 12 naturally varies as a function of temperature, and to understand how the delay through the VDL 12 varies as a function of VccVDL, so that it can be understood how the latter can be used to compensate for the former. Understanding how the delay varies in accordance with both of these variables (temperature, VccVDL) can be achieved by computer modeling, by actual device testing, or a combination of both. In any event, once these relationships are understood, it is then known what VccVDL value is appropriate to cancel the effects of temperatures on the delay, which in turn allows the designer to choose appropriate resistor values in FIG. 5 via Equation (1). Such optimization of the circuitry is well within the knowledge of one skilled in the art.

Figure 1:
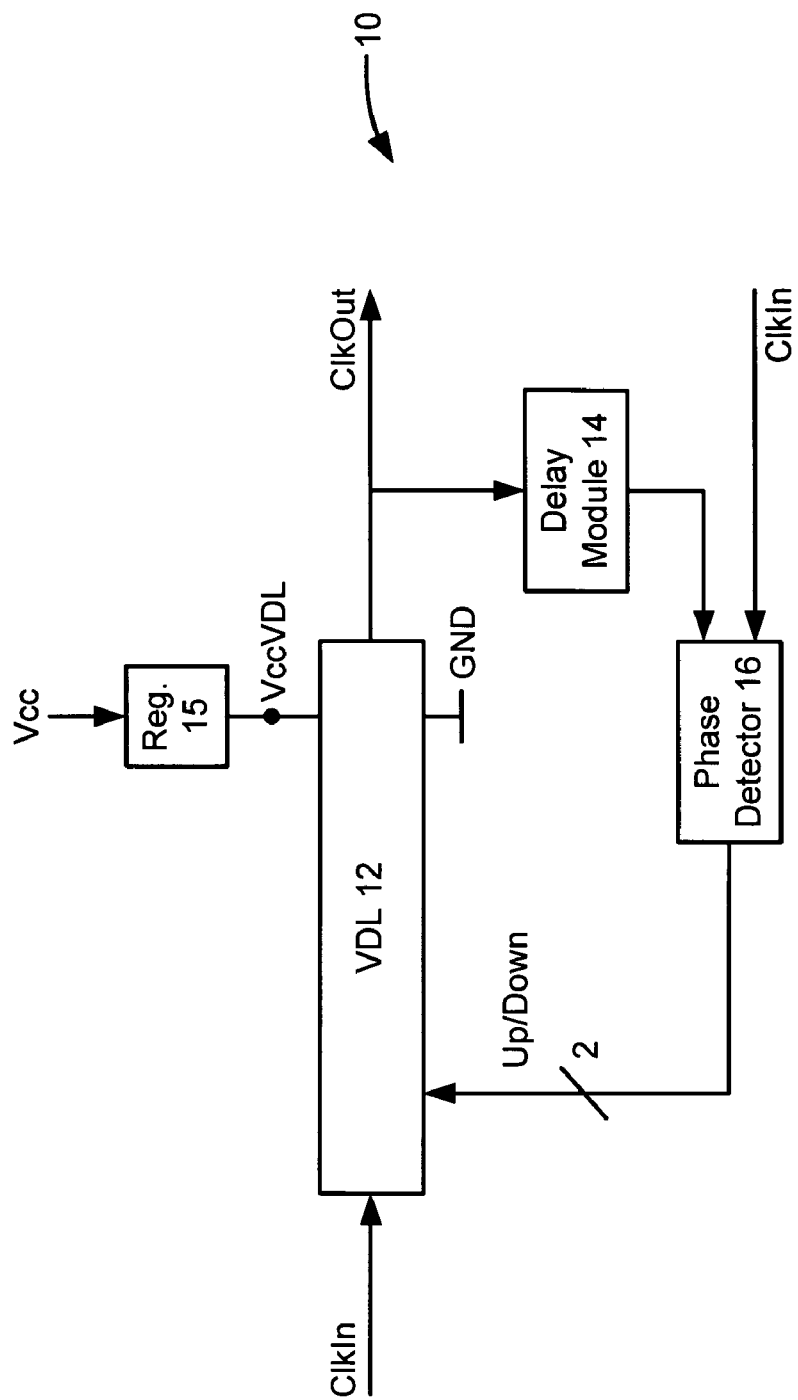
FIG. 1 illustrates a prior art delay locked loop (DLL) and the use of a variable delay line (VDL) within the DLL.
Figure 2:
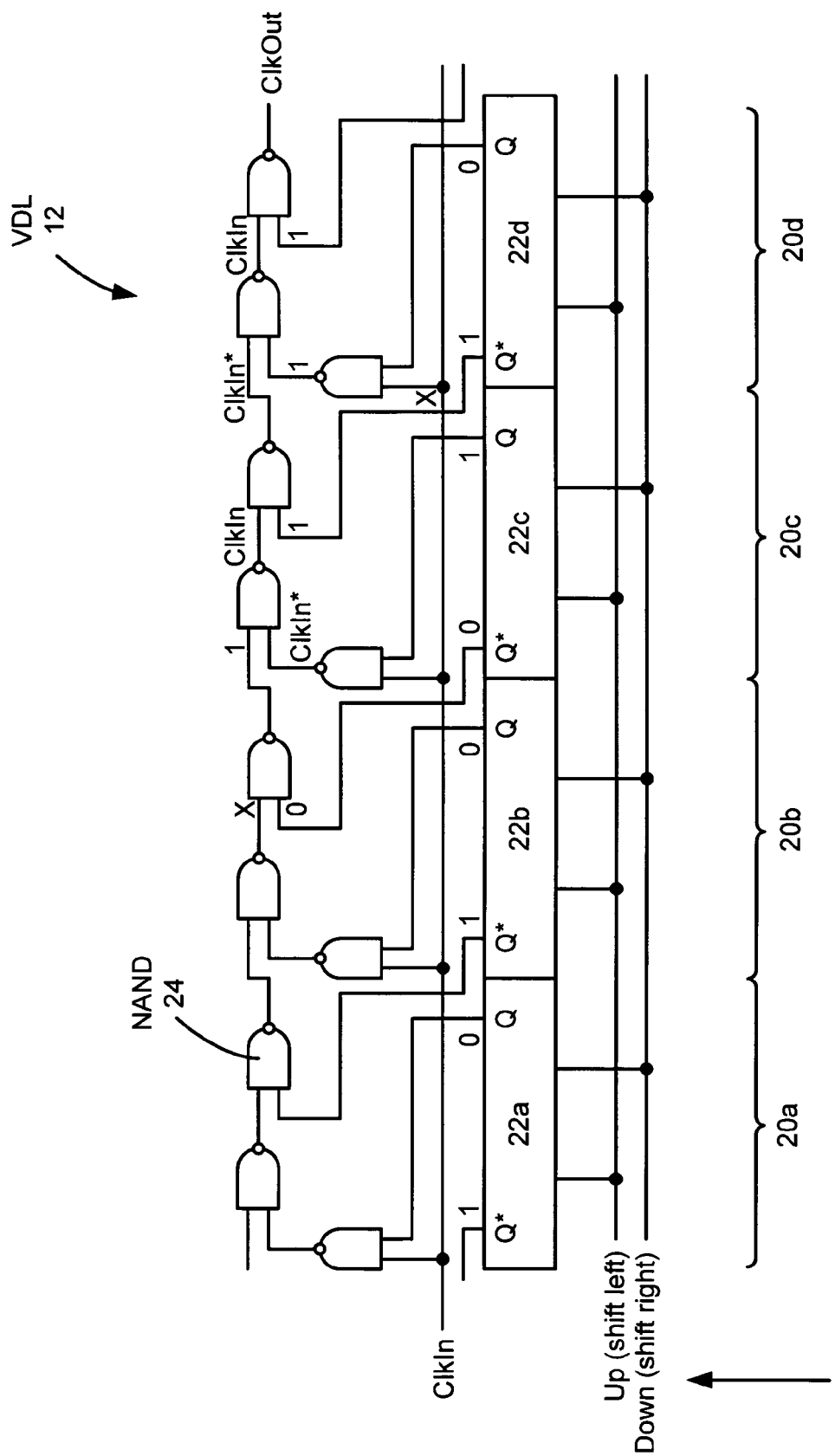
FIG. 2 illustrates the VDL of FIG. 1 in further detail.
Figure 6A:
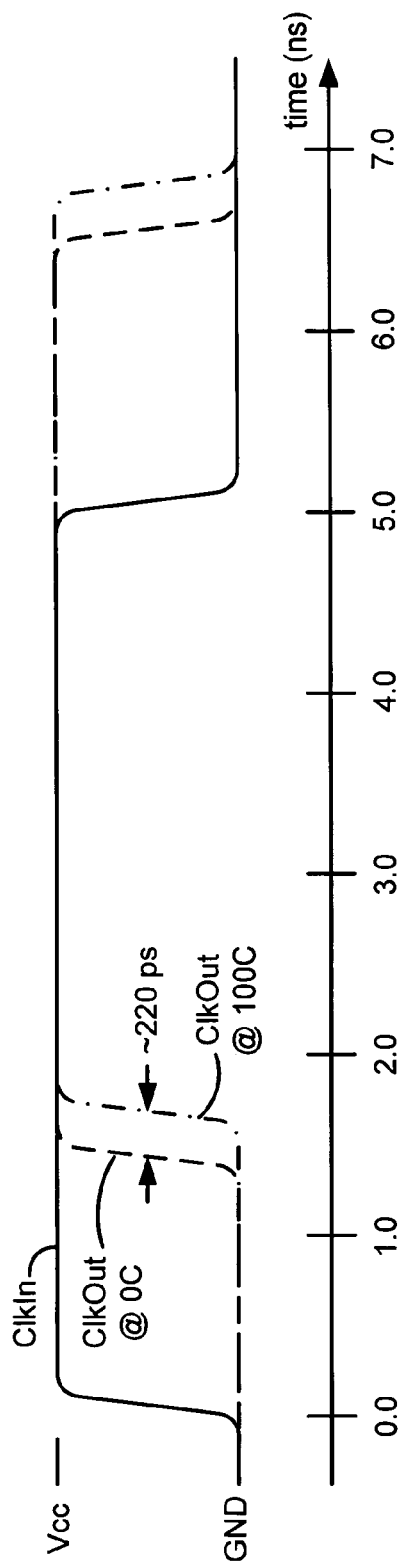
FIGS. 6A and 6B respectively illustrate the temperature dependence of the delay through the VDL in accordance with the prior art and an embodiment of the invention.
Figure 6B:
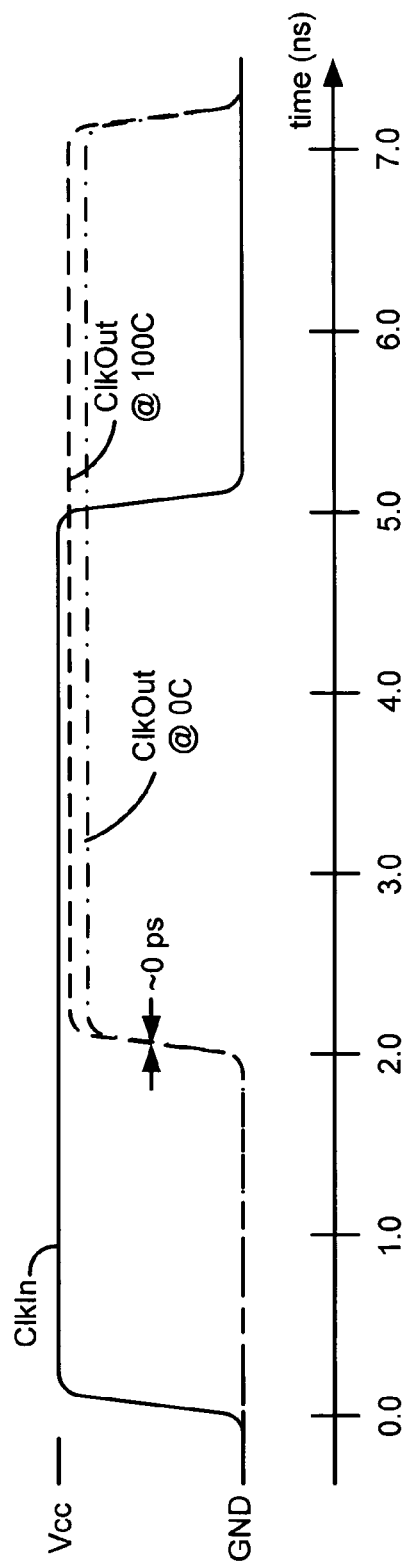

Simulated results are shown in FIGS. 6A and 6B. Whereas the delay through the VDL 12 is shown to be temperature dependent in the prior art, varying by approximately 220 picoseconds from 0 to 100 C (FIG. 6A), when the disclosed embodiment is used, the variance in the delay is reduced to a negligible amount (FIG. 6B). Because the improved regulator 15' will produce an output voltage VccVDL (ClkOut) which is necessarily smaller than Vcc by virtue of some voltage drop across the P-channel pass element 62 (FIG. 4), it can be noticed in FIG. 6B that the VDL output is slightly smaller than Vcc, and becomes even smaller as the temperature decreases (see about Table 1 above). The smaller power supply voltage will necessary also increase the delay as compared to the prior art, and thus the traces are shifted to the right as between FIGS. 6A and 6B. However, this is unimportant, as the feedback loop of the DLL 10' compensates for this shift by adjusting the VDL 12's delay using the Up/Down signals (not shown in FIG. 6B). (The delay model 14 (FIG. 1) in the feedback loop normally involves DC level shifting the input voltage to a desired drive voltage. If control circuitry in the DLL is desired to be powered by a standard Vcc bus, then this level translation should be accounted for in the delay module 14. Placing it in the loop will of course incorporate any delay effects into the locking phase. In general, level translation, which is well known in the art, is best performed in the output drive stage of any wave-shaping circuit).

Figure 7:
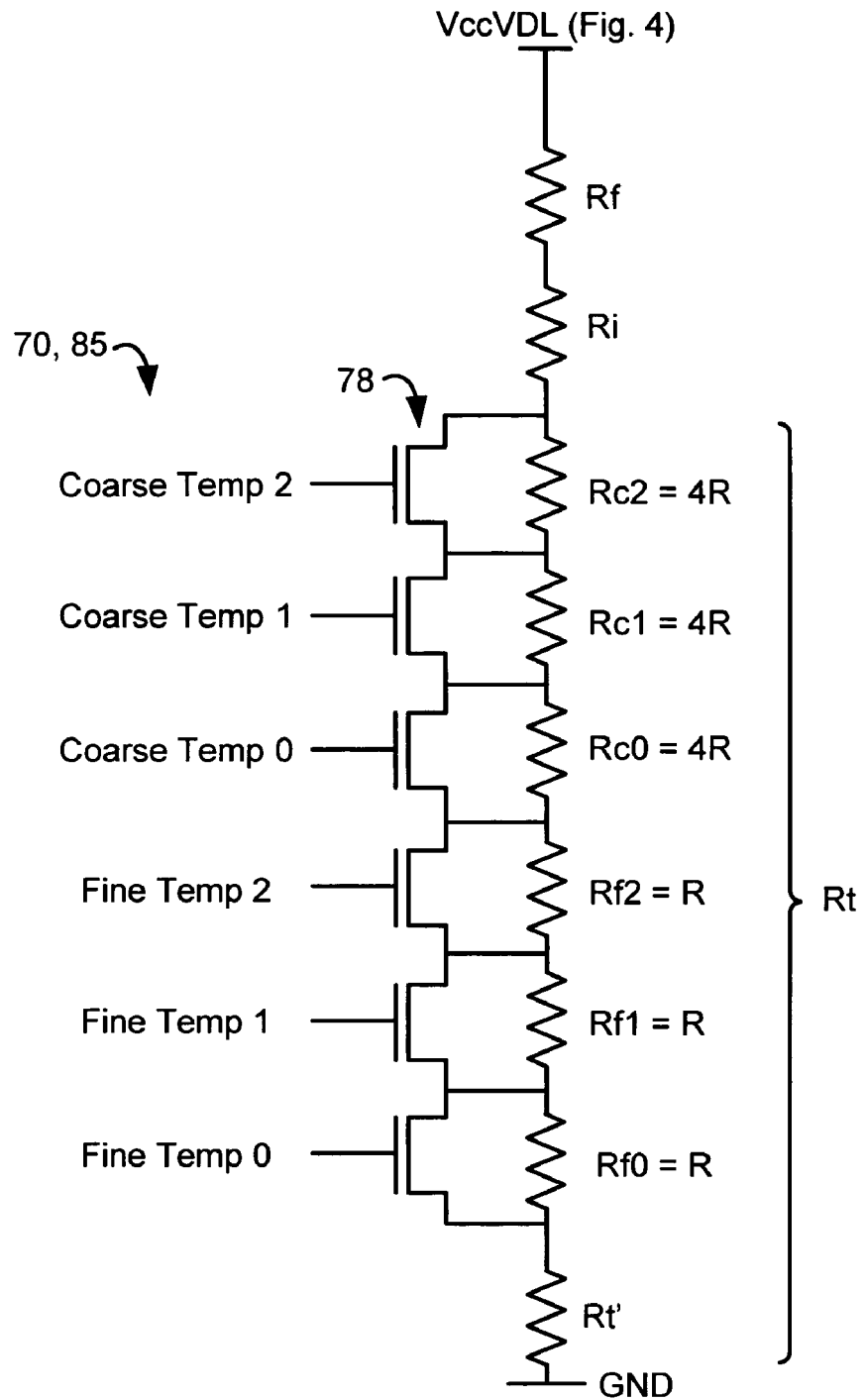
FIG. 7 illustrates how the temperature quantizer of FIG. 5 can be further improved through the use of coarse and fine temperature adjustments to the regulator.

FIG. 7 shows another embodiment of portions of the improved regulator 15', and specifically the load of the regulator comprising the gain resistor Rt. As shown in this example, the values of the smaller resistors in Rt are divided into coarse (Rcx) and fine (Rfx) values. In the specific example shown, the coarse resistors Rcx are four times the value of the fine resistors Rfx. Weighting the resistors in this manner allows for finer control of VccVDL, meaning that each quantized temperature range is narrower. Control signals "Coarse Temp" and "Fine Temp" ultimately control the total resistance of Rt, and hence the VccVDL value. Thus, as shown, sixteen different values for Rt can be achieved, ranging from Rt=0 (all control signals asserted) to Rt=15R in one R increments. For example, Rt=R can be achieved by asserting all control signals except Fine Temp 0; Rt=2R can be achieved by asserting all control signals except Fine Temp 0 and Fine Temp 1; Rt=3R can be achieved by asserting only the Coarse Temp control signals; Rt=4R can be achieved by asserting all control signals except Coarse Temp 0; Rt=5R can be achieved by asserting all control signals except Coarse Temp 0 and Fine Temp 0; etc.

In FIG. 7, the coarse and fine control signals are indicative of the temperature, and thus comprise another form of temperature information 70 as discussed earlier (see FIG. 3). These control signals can be generated via a 16-element voltage divider, similar to that shown in FIG. 5 (74). In any event, because one skilled in the art will know how to generate the necessary coarse and fine control signals to assist in the operation of the regulator 15', further details of this embodiment are not discussed for brevity.

As noted earlier in the Background section, the problem of temperature variation in the delay of VDLs 12 as used in DLLs is not unique to merely those types of delay elements. Indeed, all uncompensated delay elements will exhibit the same type of temperature dependence: longer delays at higher temperatures and smaller delays at lower temperatures. As noted earlier, this can generally be an undesirable effect in delay elements, which ideally should produce delays which are temperature independent.

Figure 8A:
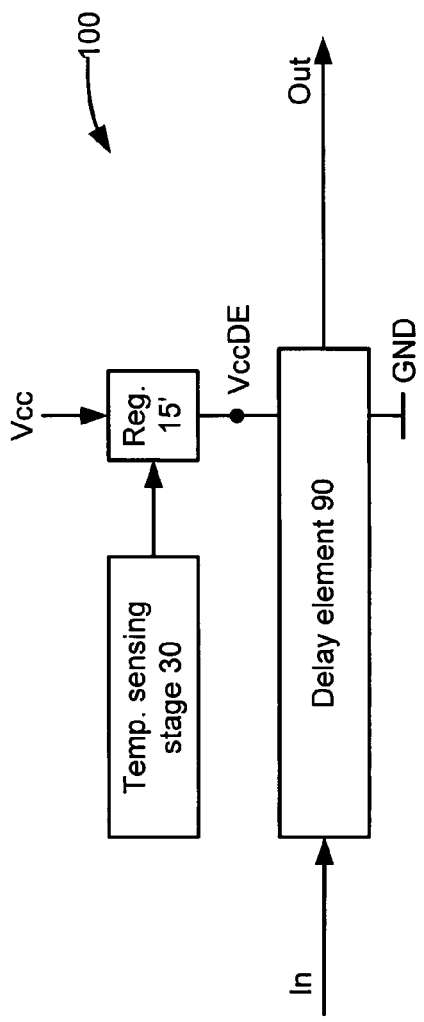
FIGS. 8A and 8B illustrate how embodiments of the invention can be used to temperature compensate a generic delay element or other subcircuit so as to produce a temperature-independent delay.
Figure 8B:
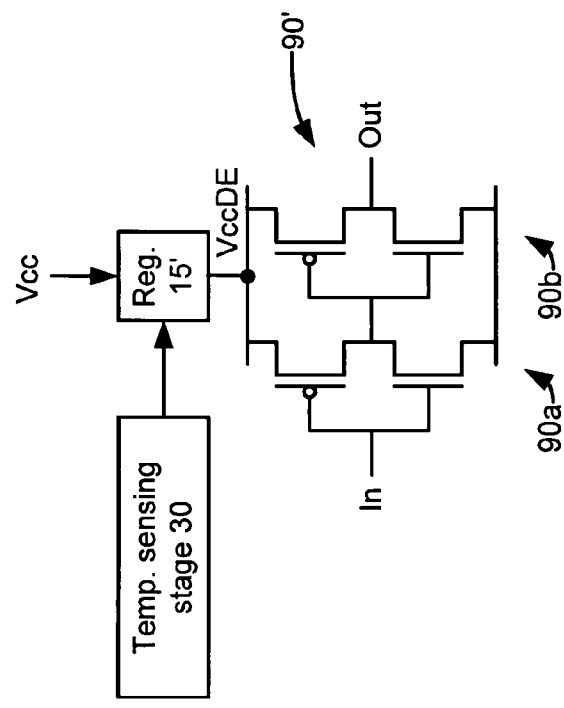

Accordingly, FIGS. 8A and 8B show the extension of the invention to delay elements 90 generally. As shown, delay elements, regardless of their constitution, will ultimately be powered by a power supply, called VccDE in FIG. 8. By controlling the value of this power supply in light of sensed temperatures, the delay element 90 can be made to have a set delay which does not substantially vary with temperature. Just as was the case with the VDL 12, when the sensed temperature is high as reported by the temperature sensing stage 30, the regulator 15' increases the power supply voltage for the delay element 90 (VccDE) to offset the inherent temperature-based increase in the delay, and vice versa for sensed low temperatures. The results are outputs whose delays are relatively invariable with temperature. FIG. 8B shows the concepts of the invention as applied to the specific example of a simple delay element, in the case, two serially-connected inverters 90a, and 90b.

It should also be noted that the invention has applicability even beyond mere delay elements, and can apply to setting the power supply voltage for any subcircuit in an integrated circuit, whether that subcircuit is intended to provide a delay or not. The reality is that any subcircuit will have some amount of inherent delay, and even if a given subcircuit is not intended to produce a delay, it may still be the case that the inherent delay in the subcircuit should be temperature independent. Accordingly, embodiments of the invention may be used to set the value of that subcircuit's power supply voltage. Accordingly, it should be understood in FIG. 8B that the subcircuit 90' depicted can comprise any subcircuit in an integrated circuit regardless of its intended function as a delay element or not.

As used herein, a "delay" comprises an output signal either leading or lagging an input signal. Thus, in the disclosed DLL, although technically the output clock is said to lead the input clock, it should be understood due to the cyclical nature of clock signals that such leading can also be interpreted as lagging, and hence comprises a "delay" in the output clock signal.

In the disclosed embodiment, note that the value of the power supply is made to scale proportionally to the sensed temperature (see Table 1). However, this should not be understood as meaning that the regulated power supply and the sensed temperature will linearly scale, or scale according to any particular mathematical formula. Instead, that the "value of the power supply scales proportionally to the sensed temperature" should be understood as meaning that as the sensed temperature increases the value of the power supply also increases, and as the sensed temperature decreases the value of the power supply also decreases.

While a preferred embodiment of the invention has been disclosed, it should be understood that the disclosed circuitry can be achieved in many different ways to the same useful ends as described herein. In short, it should be understood that the inventive concepts disclosed herein are capable of many modifications. To the extent such modifications fall within the scope of the appended claims and their equivalents, they are intended to be covered by this patent.

What is claimed is:

1. A delay locked loop for an integrated circuit, comprising:
   a delay element for receiving an input clock and for producing at least one output clock delayed with respect to the input clock;
   a regulator for providing a power supply voltage for the delay element; and
   a temperature sensor for sensing temperature and for providing temperature information to the regulator,
   wherein the temperature information is used by the regulator to modify the power supply voltage,
   and wherein modifying the power supply voltage comprises scaling the power supply voltage in proportion to the sensed temperature such that the power supply voltage is increased as the sensed temperature increases and such that the power supply voltage is decreased as the sensed temperature decreases.

2. The delay locked loop of claim 1, wherein the regulator provides the power supply voltage for the delay element by deriving it from a first voltage.

3. The delay locked loop of claim 2, wherein the first voltage comprises a master power supply voltage for the integrated circuit.

4. The delay locked loop of claim 1, wherein the temperature information comprises a plurality of digital signals.

5. The delay locked loop of claim 1, wherein the temperature information is quantized into a plurality of temperature ranges.

6. A delay locked loop for an integrated circuit, comprising:
   a delay element for receiving an input clock and for producing at least one output clock delayed with respect to the input clock in accordance with at least one control signal;
   a phase detector for receiving the input clock and a representation of the one output clock and for producing the at least one control signal;
   a regulator for producing a power supply voltage for the delay element; and
   a temperature sensor for sensing temperature and providing temperature information to the regulator,
   wherein the temperature information is used by the regulator to scale the power supply voltage in proportion with the sensed temperature such that the power supply voltage is increased as the sensed temperature increases and such that the power supply voltage is decreased as the sensed temperature decreases.

7. The delay locked loop of claim 6, wherein the regulator produces the power supply voltage for the delay element by deriving it from a first voltage.

8. The delay locked loop of claim 7, wherein the first voltage comprises a master power supply voltage for the integrated circuit.

9. The delay locked loop of claim 6, wherein the temperature information comprises a plurality of digital signals.

10. The delay locked loop of claim 6, wherein the temperature information is quantized into a plurality of temperature ranges.

11. The delay locked loop of claim 6, wherein the representation of the one output clock comprises the one output clock as delay through a delay module.

12. A method for controlling a delay locked loop in an integrated circuit, comprising:
    sensing a temperature of the integrated circuit using a temperature sensor, wherein the temperature sensor receives a temperature-independent reference voltage as an input; and
    sending at least one signal indicating the sensed temperature to a regulator to set the value of a power supply voltage for a delay element in the delay locked loop,
    wherein setting the value of the power supply voltage comprises scaling the power supply voltage in proportion to the sensed temperature such that the power supply voltage is increased as the sensed temperature increases and such that the power supply voltage is decreased as the sensed temperature decreases.

13. The method of claim 12, wherein setting the value of the power supply voltage comprises deriving it from a first voltage.

14. The method of claim 13, wherein the first voltage comprises a master power supply voltage for the integrated circuit.

15. The method of claim 12, wherein the at least one signal comprises a plurality of digital signals.

16. The method of claim 12, wherein the at least one signal indicates the sensed temperature by indicating a temperature range containing the sensed temperature.

17. An integrated circuit, comprising:
    a delay element powered by a power supply node;
    a regulator for providing a power supply voltage to the power supply node; and
    a temperature sensor for providing temperature information to the regulator,
    wherein the temperature information is used by the regulator to modify the power supply voltage,
    and wherein modifying the power supply voltage comprises scaling the power supply voltage in proportion to the sensed temperature such that the power supply voltage is increased as the sensed temperature increases and such that the power supply voltage is decreased as the sensed temperature decreases.

18. The integrated circuit of claim 17, wherein the regulator provides the power supply voltage by deriving it from a first voltage.

19. The integrated circuit of claim 18, wherein the first voltage comprises a master power supply voltage for the integrated circuit.

20. The integrated circuit of claim 17, wherein the temperature information comprises a plurality of digital signals.

21. The integrated circuit of claim 17, wherein the temperature information is quantized into a plurality of temperature ranges.

22. A method for controlling a delay element in an integrated circuit, comprising:
  sensing a temperature of the integrated circuit using a temperature sensor, wherein the temperature sensor receives a temperature-independent reference voltage as an input; and
  sending at least one signal indicating the sensed temperature to a regulator to set the value of a power supply voltage for the delay element,
  wherein the value of the power supply voltage is set to scale in proportion to the sensed temperature such that the power supply voltage is increased as the sensed temperature increases and such that the power supply voltage is decreased as the sensed temperature decreases.

23. The method of claim 22, wherein setting the value of the power supply voltage comprises deriving it from a first voltage.

24. The method of claim 23, wherein the first voltage comprises a master power supply voltage for the integrated circuit.

25. The method of claim 22, wherein the at least one signal comprises a plurality of digital signals.

26. The method of claim 22, wherein the at least one signal indicates the sensed temperature by indicating a temperature range containing the sensed temperature.

27. A temperature sensor for an integrated circuit, comprising:
  at least one temperature sensitive element for producing a first analog voltage indicative of a sensed temperature;
  means for receiving at least the first analog voltage and for producing a plurality of digital signals indicative of one of a plurality of temperature ranges corresponding to the sensed temperature; and
  a regulator with a load for producing a second quantized analog voltage indicative of one of the temperature ranges, wherein the plurality of digital signals modify the load to set the second analog voltage,
  wherein the means for receiving further comprises a plurality of comparators, wherein the output of each of the comparators comprises one of the plurality of digital signals.

28. The temperature sensor of claim 27, wherein the temperature sensitive element comprises a P-N junction.

29. The temperature sensor of claim 27, wherein the second quantized analog voltage comprises a power supply voltage.

30. The temperature sensor of claim 27, wherein the comparators receive at one input a voltage indicative of the first analog voltage.

31. The temperature sensor of claim 27, wherein the digital signals modify the load by including or discluding resistances in the load.

32. A method for generating a power supply voltage for an integrated circuit device, comprising:
  producing an analog signal indicative of the sensed temperature, wherein the analog signal indicative of the sensed temperature comprises a diode voltage;
  converting the analog signal to a plurality of digital signals, wherein the digital signals are indicative of a temperature range corresponding to the sensed temperature; and
  using the digital signals to produce a second quantized analog value also indicative of the temperature range,
  wherein the second quantized analog value comprises a power supply voltage for a subcircuit in the integrated circuit device, wherein the power supply voltage is increased as the sensed temperature increases, and wherein the power supply voltage is decreased as the sensed temperature decreases.

33. The method of claim 32, wherein converting the analog signal to a plurality of digital signals comprises the use of a plurality of comparators.

34. The method of claim 32, wherein the digital signals are used to modify a load used in the production of the second quantized analog voltage.

35. The method of claim 34, wherein modifying the load comprises modifying the resistance of the load.

36. A method for sensing the temperature of an integrated circuit device, comprising:
  producing an analog signal indicative of the sensed temperature;
  converting the analog signal to a plurality of digital signals, wherein the digital signals are indicative of a temperature range corresponding to the sensed temperature; and
  using the digital signals to produce a quantized analog value also indicative of the temperature range,
  wherein converting the analog signal to a plurality of digital signals comprises the use of a plurality of comparators.

37. The method of claim 36, wherein the digital signals are used to modify a load used in the production of the quantized analog voltage.

38. The method of claim 37, wherein modifying the load comprises modifying the resistance of the load.

* * * * *

UNITED STATES PATENT AND TRADEMARK OFFICE
CERTIFICATE OF CORRECTION

| | | |
|---|---|---|
| PATENT NO. | : 7,936,203 B2 | Page 1 of 1 |
| APPLICATION NO. | : 11/351037 | |
| DATED | : May 3, 2011 | |
| INVENTOR(S) | : David Zimlich | |

It is certified that error appears in the above-identified patent and that said Letters Patent is hereby corrected as shown below:

On the title page, item (57), under "Abstract", in column 2, line 15, delete "though" and insert -- through --, therefor.

Signed and Sealed this
Twenty-eighth Day of June, 2011

David J. Kappos
*Director of the United States Patent and Trademark Office*